US008810251B2

(12) United States Patent
Koliwad et al.

(10) Patent No.: US 8,810,251 B2
(45) Date of Patent: Aug. 19, 2014

(54) SYSTEMS, METHODS, AND APPARATUS FOR LOCATING FAULTS ON AN ELECTRICAL DISTRIBUTION NETWORK

(75) Inventors: Ajay Koliwad, Trevose, PA (US); Mark Adamiak, Paoli, PA (US)

(73) Assignee: General Electric Company, Schenectady, NY (US)

( * ) Notice: Subject to any disclaimer, the term of this patent is extended or adjusted under 35 U.S.C. 154(b) by 314 days.

(21) Appl. No.: 13/222,808

(22) Filed: Aug. 31, 2011

(65) Prior Publication Data

US 2013/0049764 A1 Feb. 28, 2013

(51) Int. Cl.
*G01R 31/08* (2006.01)

(52) U.S. Cl.
USPC .......................................................... 324/522

(58) Field of Classification Search
USPC ........................ 324/512, 522, 525; 702/57–80
See application file for complete search history.

(56) References Cited

U.S. PATENT DOCUMENTS

| 4,996,624 | A | 2/1991 | Schweitzer, III |
| 5,839,093 | A | 11/1998 | Novosel et al. |
| 6,360,178 | B1 * | 3/2002 | Parsons et al. ................... 702/65 |
| 6,385,561 | B1 | 5/2002 | Soraghan et al. |
| 6,459,997 | B1 * | 10/2002 | Andersen ......................... 702/57 |
| 6,483,435 | B2 | 11/2002 | Saha et al. |
| 6,545,482 | B1 * | 4/2003 | Fedirchuk et al. ............. 324/522 |
| 6,822,457 | B2 | 11/2004 | Borchert |
| 2005/0110646 | A1 * | 5/2005 | Curtis ............................ 340/657 |
| 2007/0055889 | A1 * | 3/2007 | Henneberry et al. .......... 713/186 |
| 2010/0017214 | A1 * | 1/2010 | Ambrosio et al. ................. 705/1 |
| 2010/0286840 | A1 * | 11/2010 | Powell et al. .................. 700/295 |

* cited by examiner

*Primary Examiner* — Melissa Koval
*Assistant Examiner* — Daniel Miller
(74) *Attorney, Agent, or Firm* — Sutherland Asbill & Brennan LLP

(57) ABSTRACT

Certain embodiments of the invention include systems, methods, and apparatus for locating faults on an electrical distribution network. According to an example embodiment of the invention, a method is provided for locating faults on an electrical distribution network. The method can include monitoring, by one or more smart meters, a plurality of voltage values associated with the electrical distribution network; and when one or more of the plurality of monitored voltage values are detected to be less than or equal to a predetermined voltage for a specified time: storing at least a portion of monitored line voltage values; indicating a detected fault by transmitting one or more messages from the one or more smart meters or line sensors to a central station receiver, and determining a fault location based at least in part on the one or more messages and a topological and electrical model of the electrical distribution network.

20 Claims, 4 Drawing Sheets

SYSTEMS, METHODS, AND APPARATUS FOR LOCATING FAULTS ON AN ELECTRICAL DISTRIBUTION NETWORK

FIELD OF THE INVENTION

This invention generally relates to electrical distribution networks, and in particular, to locating faults on an electrical distribution network.

BACKGROUND OF THE INVENTION

When an electric power fault occurs in an electrical distribution network, protection devices such as circuit breakers, contactors, relays, etc., can be used to disconnect and/or isolate the faulted sections of the network. Locating the fault when it occurs is one of the many challenges associated with managing a distribution network, but reliable operation of the electrical distribution network requires quick and accurate fault location so that the faulted section can be isolated and repaired, and so power can be quickly restored to customers who are not serviced by the faulted line section.

BRIEF SUMMARY OF THE INVENTION

Some or all of the above needs may be addressed by certain embodiments of the invention. Certain embodiments of the invention may include systems, methods, and apparatus for locating faults on an electrical distribution network.

According to an example embodiment of the invention, a method is provided for locating faults on an electrical distribution network. The method includes monitoring, by one or more smart meters, a plurality of voltage values associated with the electrical distribution network; and when one or more of the plurality of monitored voltage values are detected to be less than or equal to a predetermined voltage for a specified time, storing at least a portion of the monitored line voltage values; indicating a detected fault by transmitting one or more messages from the one or more smart meters to a central station receiver, wherein the one or more messages comprise the monitored and stored line voltage values; receiving the transmitted one or more messages at the central station receiver; and determining a fault location based at least in part on the one or more messages and a topological and an electrical model of the electrical distribution network.

According to another example embodiment, a system is provided for locating faults on an electrical distribution network. The system includes an electrical power distribution network; at least one central station receiver; one or more smart meters configured to communicate with the at least one central station receiver, wherein the one or more smart meters are configured for monitoring a plurality of voltages associated with the electrical power distribution network; and when one or more of the plurality of monitored voltage values are detected to be less than or equal to a predetermined voltage for a specified time, storing at least a portion of the monitored line voltage values; indicating a detected fault by transmitting one or more messages from the one or more smart meters to a central station receiver, wherein the one or more messages comprise the monitored and stored line voltage values; receiving the transmitted one or more messages at the central station receiver; and determining a fault location based at least in part on the one or more messages and a model of the electrical distribution network.

According to another example embodiment, an apparatus is provided for locating faults on an electrical distribution network. The apparatus includes at least one central station receiver; one or more smart meters configured to communicate with the at least one central station receiver, wherein the one or more smart meters are configured for monitoring a plurality of voltages associated with an electrical power distribution network; and when one or more of the plurality of monitored voltage values are detected to be less than or equal to a predetermined voltage for a specified time: storing at least a portion of the monitored line voltage values; indicating a detected fault by transmitting one or more messages from the one or more smart meters to a central station receiver, wherein the one or more messages comprise the monitored and saved line voltage values; receiving the transmitted one or more messages at the central station receiver; and determining a fault location based at least in part on the one or more messages and a topological and an electrical model of the electrical distribution network.

Other embodiments, features, and aspects of the invention are described in detail herein and are considered a part of the claimed inventions. Other embodiments, features, and aspects can be understood with reference to the following detailed description, accompanying drawings, and claims.

BRIEF DESCRIPTION OF THE FIGURES

Reference will now be made to the accompanying tables and drawings, which are not necessarily drawn to scale, and wherein.

DETAILED DESCRIPTION OF THE INVENTION

Figure 1:
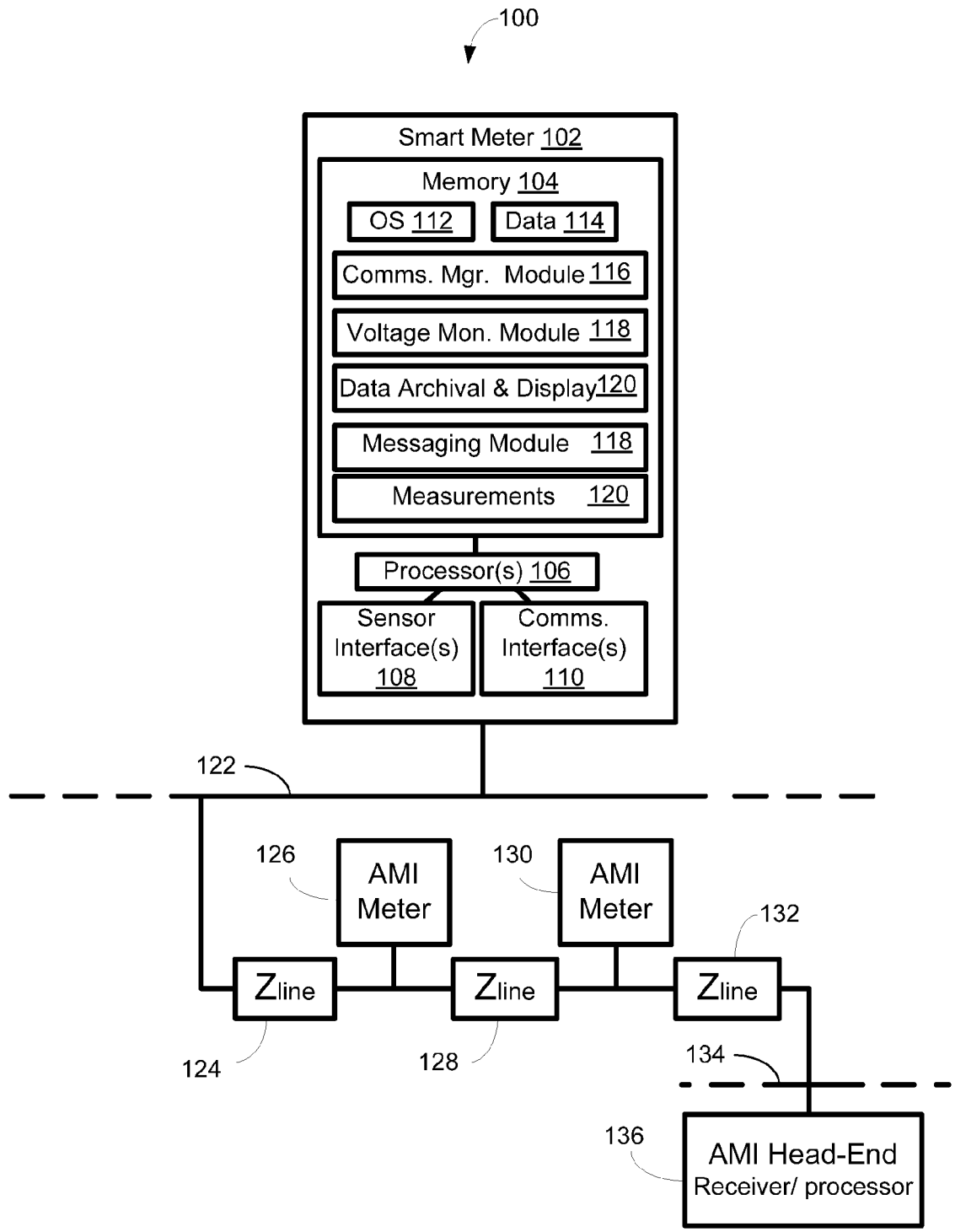
FIG. 1 is a block diagram of an illustrative fault location system, according to an example embodiment of the invention.

Embodiments of the invention will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Example embodiments of the invention utilize revenue meters in conjunction with an Advanced Meter Infrastructure (AMI) system to determine the location of a fault in an electrical network. Such information helps minimize the outage by allowing intelligent electrical switching operations to isolate the faulted network segment, and to reduce the duration of the interruption to customers who are affected.

Certain example embodiments of the invention utilize an AMI system for providing communications between meters and an AMI head end or central station. For example, an AMI system includes a plurality of electric power meters (smart meters) installed across the distribution network to meter the consumption of electric energy by various consumers. The AMI meters include communication modules that can facilitate wireless or wired communications with the other AMI meters or AMI head ends.

A typical AMI system may include a data concentrator, or aggregator, that can be in communication with several AMI meters and/or an AMI head end. According to an example embodiment of the invention, the AMI head end includes one or more computer systems to provision, manage, and communicate with the AMI meters. The AMI head end provides data and information services to several other applications in the electric utility enterprise including billing, customer information, power systems operation etc.

The AMI system can be modeled by The Electric Power Common Information Model (CIM) that is based on IEC-61968 and IEC-61970 standards. Such a network model allows a topological and electrical representation of the electrical connectivity of the AMI meters on the power system network.

In accordance with example embodiments of the invention, the AMI meters may be configured to transmit power outage information to the AMI head end. Since a power outage can also effectively shut down the AMI meters and associated communications, the power outage communication is known as the last gasp message. In an example embodiment, a globally unique ID (GUID) may be encoded in every last gasp message, and the GUID may represent a single entity (meter, position, etc.) on the network model.

According to certain example embodiments of the invention, the AMI meters may be programmed and enabled with one or more fault identification modes that can utilize the last gasp method to transmit a fault voltage profile to the AMI head end when an electric power fault causes an outage. In an example embodiment, a Fault Location Software System (FLSS) may be implemented using the AMI head end and the distribution network model to analyze the fault detection messages and determine the fault location.

According to an example embodiment, a fault detection component or circuit may be utilized to detect transient under voltage conditions associated with a power system fault. For example, the fault detection component or circuit may measure and compute the RMS or phasor magnitude of the fundamental voltage component once every cycle. Data associated with the voltage magnitude values may be captured and stored in a local Voltage Measurement buffer, and may be utilized to format a fault voltage profile for transmitting to the AMI head end during the last gasp message. According to example embodiments, since the Voltage Measurement buffer capture is synchronized to the voltage zero crossing, sophisticated time-synchronizing may not be required among the AMI meters.

In an example embodiment, when a power system fault occurs, the AMI Head end receives a last-gasp message from every affected AMI meter. This could potentially be thousands of messages. However, only a select subset of the messages contain the fault voltage profile message. In accordance with an example embodiment, the AMI Head End may route the fault voltage profile messages to the FLSS.

According to an example embodiment, after receipt of all special last gasp messages, the FLSS may sequence the messages using the GUID in order of electrical connectivity. The node that is electrically closest to the distribution substation may be designated the root node. In an example embodiment, the FLSS may implement an algorithm that inspects the fault voltage profiles from all meters that are electrically adjacent to the root node. According to an example embodiment, the Voltage Measurement buffer associated with a particular meter (and identified by the GUID) that is determined to have the lowest voltage measurement value compared to the root node provides an indication that such a meter is in a direction closer to the fault location. The FLSS then promotes this meter (or position via its GUID) as the new root node and stores the previous root node in a fault path list. According to an example embodiment of the invention, the FLSS may iteratively repeat this process until a new ROOT node can no longer be found. The FLSS then asserts the fault location to be between the last ROOT node and the next electrically adjacent AMI meters. The FLSS may also publish the fault path.

Starting from the root node, the FLSS scans all electrically adjacent fault voltage profiles to locate the meter which has the lowest voltage measurement. This permits the fault location algorithm to work in the presence of an arbitrary number of feeder laterals in the distribution network.

Multi-sourced distribution networks are supplied with electrical power from more than one source. In such configurations, the FLSS will locate multiple "root nodes", each one closest to a power source. The algorithm remains essentially unchanged, and the certainty of the fault location is improved as the processing of each root node allows the FLSS to converge on the same fault location from multiple paths.

In accordance with an example embodiment of the invention, a review of the fault voltage profiles of all electrically adjacent meters may obviate the need to know or configure system parameters such as line impedances, conductor spacing etc.

Various meters, processors, and communication protocols for locating faults will now be described with reference to the accompanying figures.

FIG. 1 depicts a fault location system 100, according to an example embodiment of the invention. In an example embodiment, advanced metering infrastructure (AMI) meters 102, 126, 130 may communicate with each other, and to an AMI head end processor 136 or central station. In an example embodiment, the AMI meter 102 may include a memory 104, one or more processors 106, input/output interfaces 108, and/or a network interface 110. In an example embodiment, each meter may reliably and securely communicate the information collected via cell/pager networks, satellite, licensed radio, combination licensed and unlicensed radio, or power line communication. The networks that provide the communication can include fixed wireless, mesh network, or a combination of the two. Other potential network configurations include Wi-Fi and other internet related networks. According to an example embodiment, the AMI meter memory 104 may include an operating system 112, data 114, a voltage-monitoring module 116, a messaging module 118, and other AMI related modules 120. In an illustrative example embodiment, the AMI meter 102 may be in communication with tap lines 122 for which there may be line impedances 124, 128, 132 associated with the power transmission lines respectively between AMI meters 102, 126, 130 and an AMI head end receiver 136.

Figure 2:
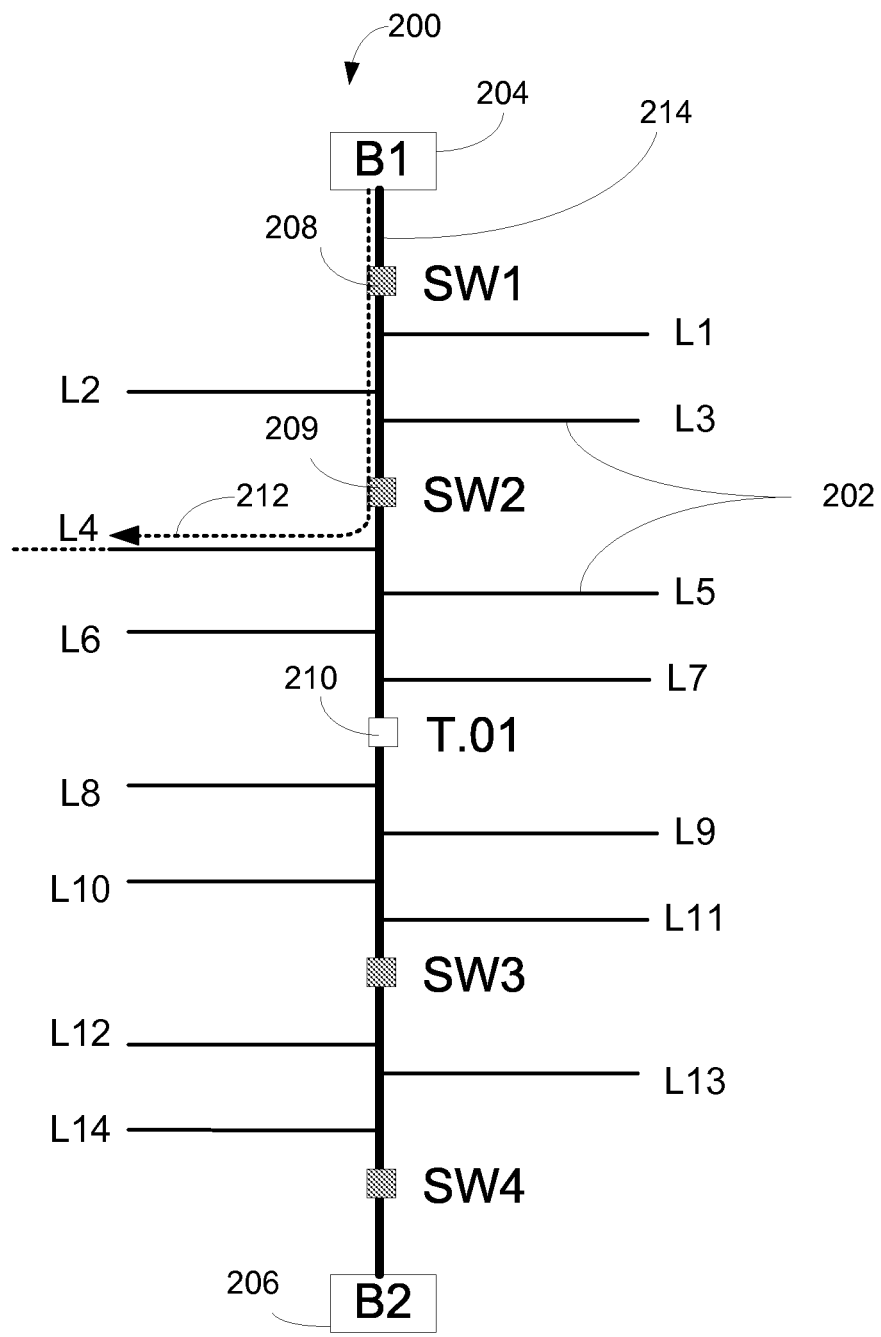
FIG. 2 is a block diagram of an illustrative power distribution network, according to an example embodiment of the invention.

FIG. 2 depicts an illustrative example power distribution network 200 that may utilize embodiments of the invention. For example, the network 200 may include branches 202 that include lines that connect to and branch off from the feeder 214 (known as laterals) for providing power to customers, or groups of customers. The network 200 may include circuit breakers 204, 206 that provide connecting/disconnecting nodes for the network 200, or for isolating certain sections from the larger network 200. According to an example embodiment, the network 200 may include sectionalizers 208, 209 that may provide further switching granularity for isolating or disconnecting certain branches 202 from the larger network 200. According to certain example embodiments of the invention, the network 200 may include one or more tie switches 210 that may tie together sections of the feeder 214. FIG. 2 also depicts an example fault path 212 that identifies one of the branches (L4) as having a fault. A fault, for example, can include any number of conditions such as shorted lines, lines shorted to ground, ground faults, or other situations that may result in an unusual amount of current flow.

Figure 3:
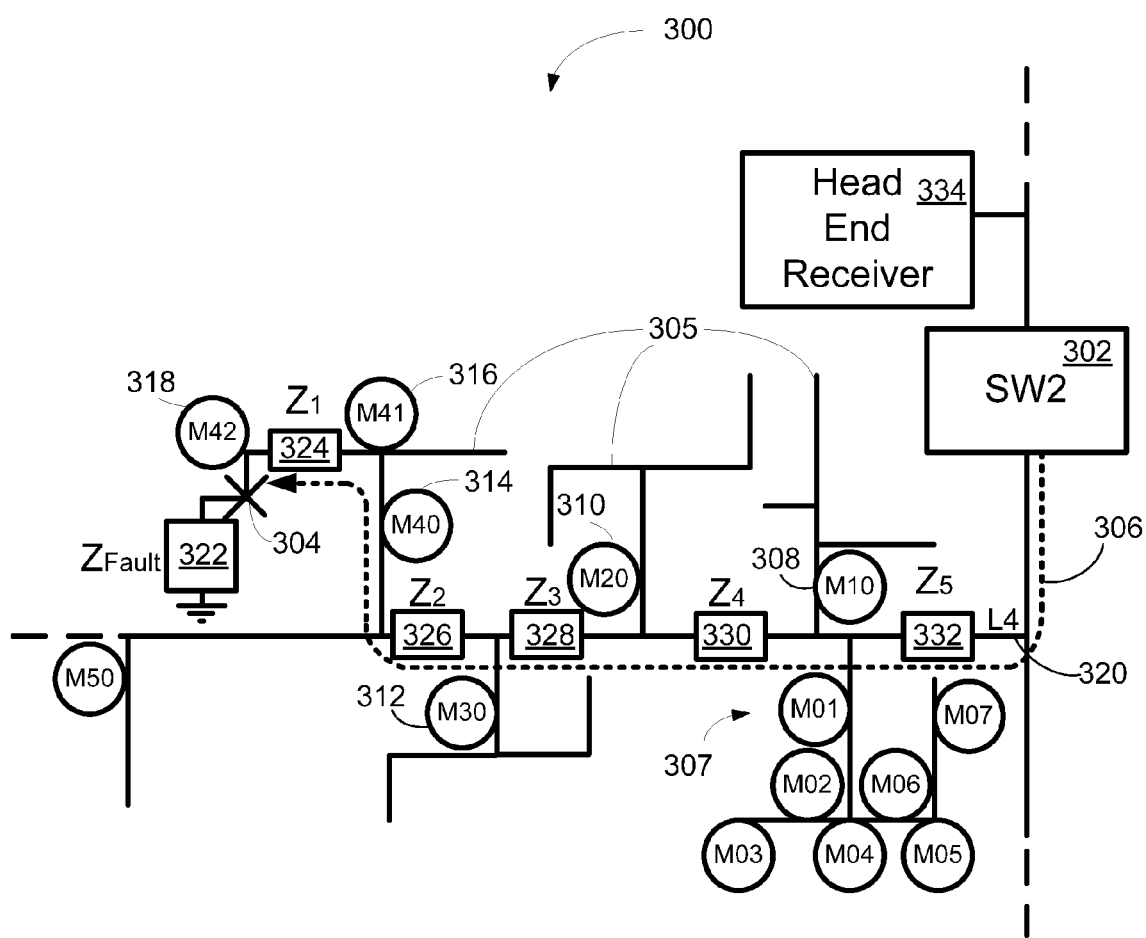
FIG. 3 is a block diagram of another illustrative power distribution network, according to an example embodiment of the invention.

FIG. 3 depicts another example network 300 (corresponding to, but with more detail and components than are shown in the network 200 of FIG. 2) that may illustrate aspects of the inventions. For example, a fault 304 may occur along a particular tap line 305. FIG. 3 shows an example fault path 306 that may start at sectionalizer 302 and trace along an affected branch 320 to the affected tap line and to the fault 304. FIG. 3 also indicates AMI meters 307 on the first tap line associated with the branch L4 320. Additional AMI meters are shown, including the first meter M10 308 on the second tap line of branch L4 320; a first meter M20 310 on the third line of branch L4 320; a first meter M30 312 on the fourth tap line of branch L4 320. Meters that are associated with the tap line under fault include M40 314, M41 316, and M42 318.

According to an example embodiment, sections of the network may include associated impedance values. For example, the fault 304 may be associated with a fault impedance to ground Zfault 322. Other impedance values may be associated with the network 300 including the tap line impedance Z1 324 between meter M42 318 and meter M41 316. Other impedances may include the second line impedance Z2 326, the third line impedance Z3 328, the fourth line impedance Z4 330, and the fifth line impedance Z5 332.

In an example embodiment, a head end receiver 334 or central station may be utilized to receive messages from the various AMI meters in the network 300, and process such messages as previously described.

According to example embodiments, AMI meters are configured with a fault-ID function and may detect and compute the RMS or phasor voltage magnitudes for transient undervoltage conditions on a per-cycle basis. The fault-ID function is a variant of a sag-detection technique, and may work in combination with a spontaneous reporting function. According to an example embodiment, the fault detection function can be triggered by an under-voltage condition. For example, if the RMS or phasor voltage magnitude of 1 or more cycles is below a configured limit, the fault detection function can be triggered. In an example embodiment, once triggered, the fault detection function starts buffering the RMS or phasor voltage measurements of up to the next 20-30 cycles or more into memory.

In an example embodiment, the outage detection function in the meter may monitor a DC voltage output of the AMI meter power supply. Once this voltage falls below an acceptable threshold, an outage event is declared in the meter. Declaration of an outage triggers the fault-ID spontaneous reporting function, and the voltage magnitudes captured by the fault detection function are reported over the AMI channel. These spontaneous messages are tagged as fault-ID last gasp messages.

According to example embodiments, when a power outage occurs, the AMI head end can potentially receive a last-gasp message from every affected meter. In an example embodiment, the AMI system (routers, concentrators, and gateways) is designed to provide preferential routing for fault-ID last-gasp messages, temporarily (for up to 10 seconds), suspending transmission of normal last-gasp messages, and making data paths available to fault-ID last-gasp messages. This ensures that the fault-ID messages arrive at the AMI head end system in advance of normal last-gasp outage notification messages.

According to an example embodiment, the AMI head end function can provide fault-ID information to a central station system which can analyze the voltage profile reported, in conjunction with an up-to-date network model, to accurately determine the fault location (to the nearest fault-ID capable meter). According to an example embodiment, the electrical fault on lateral L4 320 as shown in FIG. 3 may proceed as follows: the fault current I fault flows through the lateral L4 320 to the faulted location 304 and the voltage to each meter along the fault path may be determined. For example, VM42=I fault*Z fault; VM40=I fault*(Z fault+Z1); VM30=I fault*(Z fault+Z1+Z2); VM20=I fault*(Z fault+Z1+Z2+Z3); VM10=I fault*(Z fault+Z1+Z2+Z3+Z4); and VSW2=I fault*(Z fault+Z1+Z2+Z3+Z4+Z5). In accordance with example embodiments of the invention, these voltages are determined at each meter. Line current sensors, also possessing a communication capability, can provide time correlated fault current values that can be used to validate and enhance the voltage profile calculations developed from the smart meter voltages. It should be noted that due to the possible location of Distributed Generation on a feeder or due to back-feed from downstream motor load, even on a single-ended feeder, current may flow from the part of the feeder past the fault. In this scenario, the voltage profile will appear to look like a multi-sourced feeder and have a relative minimum voltage. The algorithm will continue searching down-stream from the fault to confirm a relative local minimum.

Referring now back to FIG. 2, and assuming tie switch TO1 210 is open, all of the power flowing through circuit breaker B1 204 is feeding the fault. Voltage levels at laterals 202 L1, L2, and L3 are higher than at SW2 209 due to the line-impedance, and such information can be utilized to locate the fault.

Figure 4:
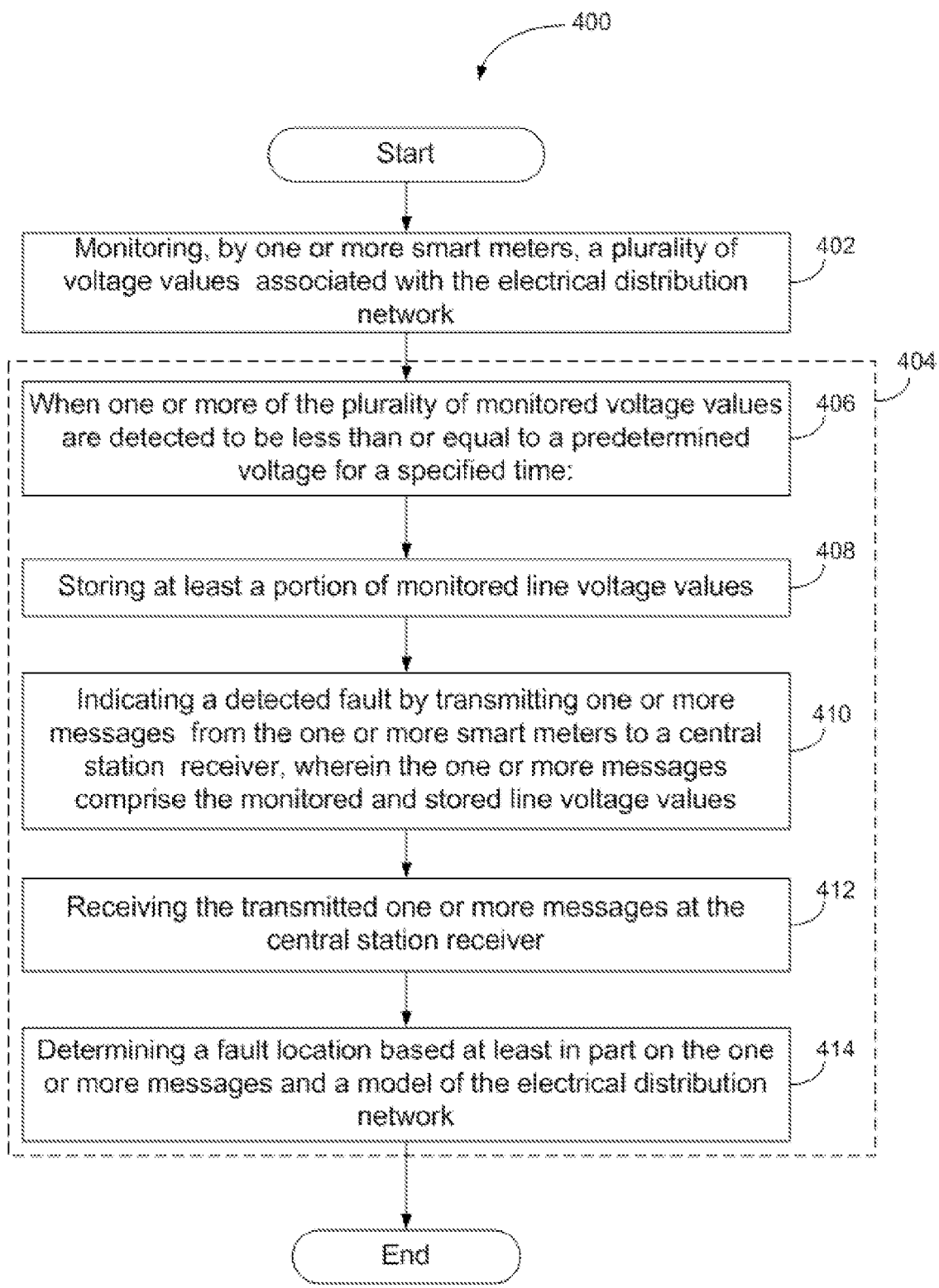
FIG. 4 is a flow diagram of an example method according to an example embodiment of the invention.

An example method 400 for locating faults on an electrical distribution network will now be described with reference to the flowchart of FIG. 4. The method 400 starts in block 402 and includes monitoring, by one or more smart meters, a plurality of voltage values associated with the electrical distribution network. Block 404 includes sub-blocks 406-414 that are activated when one or more of the plurality of monitored voltage values are detected to be less than or equal to a predetermined voltage for a specified time. For example, block 408 includes storing at least a portion of the monitored line voltage values. Block 410 includes indicating a detected fault by transmitting one or more messages from the one or more smart meters to a central station receiver, wherein the one or more messages comprise the monitored and stored line voltage values. Block 412 includes receiving the transmitted one or more messages at the central station receiver. Block 414 includes determining a fault location based at least in part on the one or more messages and a model of the electrical distribution network. The method 400 ends in block 414.

According to an example embodiment, saving at least a portion of the monitored line voltage values can include storing the RMS and/or phasor voltage magnitudes for one or more cycles of AC line voltage. In an example embodiment, monitoring the plurality of voltages can include monitoring voltages on one or more branches 202 of the electrical distribution network 200. Monitoring the plurality of voltages can also include monitoring the voltages at a plurality of tap lines 122, 305 associated with one or more branches 202 of the electrical distribution network 200.

In an example embodiment, transmitting the one or more messages from the one or more smart meters 102 to the central station receiver 136 further includes transmitting a code identifying the one or more smart meters 102. Transmitting the code identifying the one or more smart meters 102 is received by the central station receiver 136 and compared to the model of the electrical distribution network 200 to determine the locations of the one or more smart meters 102. A fault location may be determined based at least in part on modeled line impedances 124, 128, 132 between smart meters 102 of the electrical distribution network 200.

According to example embodiments, certain technical effects can be provided, such as creating certain systems, methods, and apparatus that provide an ability to isolate faulted network segments. Example embodiments of the invention can provide the further technical effects of providing systems, methods, and apparatus for improving the restoration time of faulted network segments In example embodiments of the invention, the fault location system 100, the network systems 200, and the detailed network system 300 may include any number of hardware and/or software applications that are executed to facilitate any of the operations.

In example embodiments, one or more I/O interfaces may facilitate communication between the fault location system 100, the network systems 200, and the detailed network system 300, and one or more input/output devices. For example, a universal serial bus port, a serial port, a disk drive, a CD-ROM drive, and/or one or more user interface devices, such as a display, keyboard, keypad, mouse, control panel, touch screen display, microphone, etc., may facilitate user interaction with the fault location system 100, the network systems 200, and the detailed network system 300. The one or more I/O interfaces may be utilized to receive or collect data and/or user instructions from a wide variety of input devices. Received data may be processed by one or more computer processors as desired in various embodiments of the invention and/or stored in one or more memory devices.

One or more network interfaces may facilitate connection of the fault location system 100, the network systems 200, and the detailed network system 300 inputs and outputs to one or more suitable networks and/or connections; for example, the connections that facilitate communication with any number of sensors associated with the system. The one or more network interfaces may further facilitate connection to one or more suitable networks; for example, a local area network, a wide area network, the Internet, a cellular network, a radio frequency network, a Bluetooth™ (owned by Telefonaktiebolaget LM Ericsson) enabled network, a Wi-Fi™ (owned by Wi-Fi Alliance) enabled network, a satellite-based network, any wired network, any wireless network, etc., for communication with external devices and/or systems.

As desired, embodiments of the invention may include the fault location system 100, the network systems 200, and the detailed network system 300 with more or less of the components illustrated in FIGS. 1, 2, and 3.

Certain embodiments of the invention are described above with reference to block and flow diagrams of systems, methods, apparatuses, and/or computer program products according to example embodiments of the invention. It will be understood that one or more blocks of the block diagrams and flow diagrams, and combinations of blocks in the block diagrams and flow diagrams, respectively, can be implemented by computer-executable program instructions. Likewise, some blocks of the block diagrams and flow diagrams may not necessarily need to be performed in the order presented, or may not necessarily need to be performed at all, according to some embodiments of the invention.

These computer-executable program instructions may be loaded onto a general-purpose computer, a special-purpose computer, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable memory that can direct a computer or other programmable data processing apparatus to function in a particular manner, such that the instructions stored in the computer-readable memory produce an article of manufacture including instruction means that implement one or more functions specified in the flow diagram block or blocks. As an example, embodiments of the invention may provide for a computer program product, comprising a computer-usable medium having a computer-readable program code or program instructions embodied therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, can be implemented by special-purpose, hardware-based computer systems that perform the specified functions, elements or steps, or combinations of special-purpose hardware and computer instructions.

While certain embodiments of the invention have been described in connection with what is presently considered to be the most practical and various embodiments, it is to be understood that the invention is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain embodiments of the invention, including the best mode, and also to enable any person skilled in the art to practice certain embodiments of the invention, including making and using any devices or systems and performing any incorporated methods. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A method for locating faults on an electrical distribution network, the method comprising:
monitoring, by one or more smart meters, a plurality of voltage values associated with the electrical distribution network;
detecting transient under voltage conditions associated with a power system fault by measuring and computing RMS or phasor magnitude of a fundamental voltage component once every cycle;

when one or more of the plurality of monitored voltage values indicate a power system fault:

storing at least a portion of monitored line voltage values;

formatting a fault voltage profile;

indicating a detected fault by transmitting one or more last gasp messages with a fault voltage profile immediately prior to loss of power from the one or more smart meters or line sensors to a central station receiver, wherein the one or more last gasp messages comprise the monitored and stored line voltage values and line current values;

receiving transmitted messages at the central station receiver;

determining the last gasp messages with the fault voltage profile;

sequencing the received last gasp messages with the fault voltage profile in order of electrical connectivity;

assigning a node that is closest to a distribution substation as an original root node;

inspecting the line voltage values from all the meters that are electrically adjacent to the original root node;

determining an electrically adjacent meter that has the lowest line voltage value;

promoting the electrically adjacent meter to a new root node;

continue promoting, by an iterative process, the meter that has the lowest line voltage value that is electrically adjacent to the new root node until a new root node cannot be found; and determining a fault location to be between a last determined root node and a next electrically adjacent meter.

2. The method of claim 1, wherein saving at least a portion of the monitored line voltage values comprises storing RMS or phasor voltage measurements for one or more cycles of AC line voltage.

3. The method of claim 1, wherein monitoring the plurality of voltages comprises monitoring voltages on one or more branches of the electrical distribution network.

4. The method of claim 2, wherein monitoring the plurality of voltages comprises monitoring voltages at a plurality of tap lines associated with one or more branches of the electrical distribution network.

5. The method of claim 1, wherein the monitored voltage values are augmented by current flows from line current sensors and calculating voltage drop correlations with actual monitored voltage values.

6. The method of claim 1, wherein the monitored voltage values are derived from multiple terminals and wherein determining a fault location further comprises convergence to the fault location from multiple directions.

7. The method of claim 1, wherein transmitting the one or more messages from the one or more smart meters to the central station receiver further comprises transmitting a code identifying the one or more smart meters.

8. The method of claim 7, wherein transmitting the code identifying the one or more smart meters is received by the central station receiver and compared to the model of the electrical distribution network to determine the locations of the one or more smart meters.

9. The method of claim 1, wherein determining a fault location is based at least in part on modeled line impedances and physical topology among smart meters of the electrical distribution network.

10. A system for locating faults on an electrical distribution network, the system comprising:

an electrical power distribution network;

at least one central station receiver;

one or more smart meters configured to communicate with the at least one central station receiver, wherein the one or more smart meters are configured for:

monitoring a plurality of voltages associated with the electrical power distribution network;

detecting transient under voltage conditions associated with a power system fault by measuring and computing RMS or phasor magnitude of a fundamental voltage component once every cycle;

when one or more of the plurality of monitored voltage values indicate a power system fault:

storing at least a portion of monitored line voltage values;

formatting a fault voltage profile; and indicating a detected fault by transmitting one or more last gasp messages with a fault voltage profile immediately prior to loss of power from the one or more smart meters or line sensors to a central station receiver, wherein the one or more last gasp messages comprise the monitored and stored line voltage values and line current values;

receiving transmitted messages at the central station receiver;

determining the last gasp messages with the fault voltage profile;

sequencing the received last gasp messages with the fault voltage profile in order of electrical connectivity;

assigning a node that is closest to a distribution substation as an original root node;

inspecting the line voltage values from all the meters that are electrically adjacent to the original root node;

determining an electrically adjacent meter that has the lowest line voltage value;

promoting the electrically adjacent meter to a new root node;

continue promoting, by an iterative process, the meter that has the lowest line voltage value that is electrically adjacent to the new root node until a new root node cannot be found; and determining a fault location to be between a last determined root node and a next electrically adjacent meter.

11. The system of claim 10, wherein storing at least a portion of the monitored line voltage values comprises saving RMS or phasor voltage measurements for one or more cycles of fundamental component of the AC line voltage.

12. The system of claim 10, wherein monitoring the plurality of voltages comprises monitoring voltages on one or more branches of the electrical distribution network.

13. The system of claim 10, wherein monitoring the plurality of voltages comprises monitoring voltages at a plurality of tap lines associated with one or more branches of the electrical distribution network.

14. The system of claim 10, wherein transmitting the one or more messages from the one or more smart meters to the central station receiver further comprises transmitting a code identifying the one or more smart meters.

15. The system of claim 10, wherein transmitting the code identifying the one or more smart meters is received by the central station receiver and compared to the electrical and topological model of the electrical distribution network to determine the locations of the one or more smart meters.

16. The system of claim 10, wherein determining a fault location is based at least in part on modeled line impedances between smart meters of the electrical distribution network.

17. An apparatus for locating faults on an electrical distribution network, the apparatus comprising:
  at least one central station receiver;
  one or more smart meters configured to communicate with the at least one central station receiver, wherein the one or more smart meters are configured for:
  monitoring a plurality of voltages associated with an electrical power distribution network;
  detecting transient under voltage conditions associated with a power system fault by measuring and computing RMS or phasor magnitude of a fundamental voltage component once every cycle;
  when one or more of the plurality of monitored voltage values indicate a power system fault:
  storing at least a portion of monitored line voltage values;
  formatting a fault voltage profile; and
    indicating a detected fault by transmitting one or more last gasp messages with a fault voltage profile immediately prior to loss of power from the one or more smart meters or line sensors to a central station receiver, wherein the one or more last gasp messages comprise the monitored and stored line voltage values and line current values;
    receiving transmitted messages at the central station receiver;
    determining the last gasp messages with the fault voltage profile;
    sequencing the received last gasp messages with the fault voltage profile in order of electrical connectivity;
    assigning a node that is closest to a distribution substation as an original root node;
    inspecting the line voltage values from all the meters that are electrically adjacent to the original root node;
    determining an electrically adjacent meter that has the lowest line voltage value;
    promoting the electrically adjacent meter to a new root node;
    continue promoting, by an iterative process, the meter that has the lowest line voltage value that is electrically adjacent to the new root node until a new root node cannot be found; and
    determining a fault location to be between a last determined root node and a next electrically adjacent meter.

18. The apparatus of claim 17, wherein saving at least a portion of the monitored line voltage values comprises storing RMS or phasor voltage measurements for one or more cycles the fundamental component of the AC line voltage.

19. The apparatus of claim 17, wherein monitoring the plurality of voltages comprises monitoring voltages on one or more branches of the electrical distribution network.

20. The apparatus of claim 17, wherein monitoring the plurality of voltages comprises monitoring voltages at a plurality of tap lines associated with one or more branches of the electrical distribution network.

* * * * *